United States Patent
Wu et al.

(10) Patent No.: US 10,141,412 B2
(45) Date of Patent: Nov. 27, 2018

(54) FIELD EFFECT TRANSISTOR USING TRANSITION METAL DICHALCOGENIDE AND A METHOD FOR MANUFACTURING THE SAME

(71) Applicants: National Taiwan University, Taipei (TW); TAIWAN SEMICONDUCTOR MANUFACTURING CO., LTD., Hsinchu (TW)

(72) Inventors: Yuh-Renn Wu, Taipei (TW); Chi-Wen Liu, Hsinchu (TW); Shou-Fang Chen, Kaohsiung (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 18 days.

(21) Appl. No.: 15/333,442

(22) Filed: Oct. 25, 2016

(65) Prior Publication Data

US 2018/0114839 A1   Apr. 26, 2018

(51) Int. Cl.

| H01L 29/06 | (2006.01) |
| H01L 29/772 | (2006.01) |
| H01L 29/24 | (2006.01) |
| H01L 29/04 | (2006.01) |
| H01L 29/10 | (2006.01) |
| H01L 29/417 | (2006.01) |
| H01L 29/423 | (2006.01) |

(Continued)

(52) U.S. Cl.
CPC ............ H01L 29/24 (2013.01); H01L 29/045 (2013.01); H01L 29/1033 (2013.01); H01L 29/41733 (2013.01); H01L 29/42384 (2013.01); H01L 29/66969 (2013.01); H01L 29/786 (2013.01)

(58) Field of Classification Search
CPC ............ H01L 29/0665; H01L 29/0669; H01L 29/0673; H01L 29/068; H01L 29/66818; H01L 29/41758; H01L 29/41766
See application file for complete search history.

(56) References Cited

U.S. PATENT DOCUMENTS

| 9,318,611 B2* | 4/2016 | Amari ................. H01L 51/0021 |
| 2017/0098661 A1* | 4/2017 | Rakshit ................. H01L 27/12 |
| 2017/0276641 A1* | 9/2017 | Harutyunyan ..... G01N 27/4146 |

OTHER PUBLICATIONS

Saptarshi Das et al., "High Performance Multilayer MoS2 Transistors with Scandium Contacts", Nano Letters, 2013, 13, pp. 100-105.
(Continued)

*Primary Examiner* — Steven Loke
*Assistant Examiner* — Scott Stowe
(74) *Attorney, Agent, or Firm* — McDermott Will & Emery LLP

(57) ABSTRACT

A field effect transistor (FET) includes a gate dielectric layer, a two-dimensional (2D) channel layer formed on the gate dielectric layer and a gate electrode. The 2D channel layer includes a body region having a first side and a second side opposite to the first side, the body region being a channel of the FET. The 2D channel layer further includes first finger regions each protruding from the first side of the body region and second finger regions each protruding from the second side of the body region. A source electrode covers the first finger regions, and a drain electrode covers the second finger regions.

20 Claims, 16 Drawing Sheets

(51) Int. Cl.
*H01L 29/66* (2006.01)
*H01L 29/786* (2006.01)

(56) References Cited

OTHER PUBLICATIONS

Jin-Wu Jiang et al., "Orientation Dependent Thermal Conductance in Single-Layer MoS2", Scientific Reports, 3:2209; Jul. 17, 2013, pp. 1-4.
M. V. Bollinger et al., "One-Dimensional Metallic Edge States in MoS2", Physical Review Letters, vol. 87, No. 19, Nov. 5, 2001, pp. 196803-1-198603-4.

* cited by examiner

FIELD EFFECT TRANSISTOR USING TRANSITION METAL DICHALCOGENIDE AND A METHOD FOR MANUFACTURING THE SAME

TECHNICAL FIELD

The disclosure relates to field effect transistors (FETs) using two-dimensional (2D) material and method for manufacturing the same, and more particularly to FETs using transition metal dichalcogenide (TMD), in particular, $MoS_2$, and methods for manufacturing the same.

BACKGROUND

Graphene, as a two-dimensional (2-D) material (or 2-D topological material), has emerged as a possible material for transistor applications in a sub-10 nm technology node. A 2-D material is also referred to as a signal layer material formed by a signal layer of atoms. A single layer 2-D material has a thickness equal to a diameter of the constituting atoms, or has generally a thickness in an order of tenth of nanometer or a thickness of a few nanometers. Due to its zero-bandgap nature, a low ON/OFF ratio of graphene transistors has limited its practical applications. Other 2-D materials with bandgaps, such as transition metal dichalcogenide (TMD), have attracted attention for transistor applications. However, it is generally difficult to highly dope impurities in the TMD materials.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device/apparatus may be otherwise oriented (rotated 90 degrees or at other orientations) and the spatially relative descriptors used herein may likewise be interpreted accordingly. In addition, the term "made of" may mean either "comprising" or "consisting of."

In the present disclosure, "2D" or "two-dimensional" are not necessarily used in a mathematical sense, and have meaning understood by one of ordinary skill in the art of graphene, transition metal dichalcogenide (TMD) or similar material.

Figure 1A:
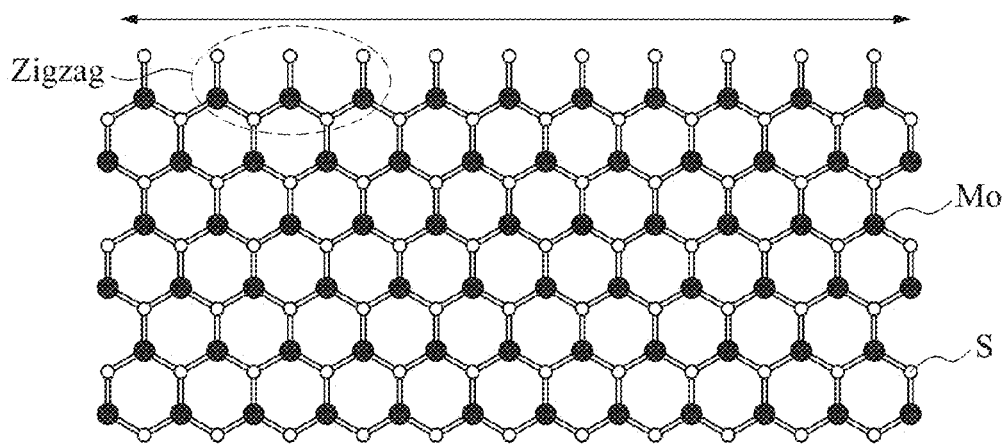
FIGS. 1A and 1B are illustrations showing edge structures of $MoS_2$.
Figure 1B:
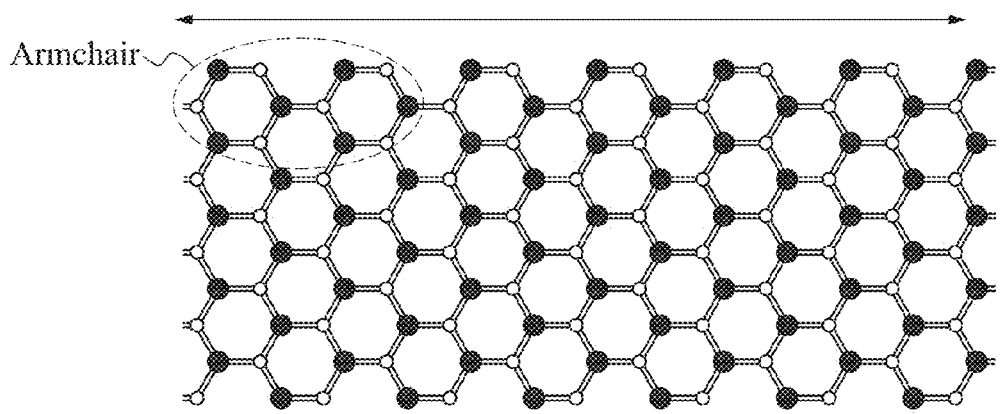

FIGS. 1A and 1B are illustrations showing edge structures of $MoS_2$. It is known that a 2D-material, such as graphene, transition metal dichalcogenide (TMD) including $MoS_2$ or $WS_2$, have different edge structure having different electrical properties. One of the edge structures is called a zigzag edge structure as shown in FIG. 1A, and another of the edge structures is called an armchair edge structure as shown in FIG. 1B. In the zigzag edge structure, the edge extends perpendicular to the atomic bonds located at the edge, and carriers are transported along this direction (see, the arrow in FIG. 1A). In the armchair edge structure, the edge extends parallel to the atomic bonds located at the edge, and carriers are transported along this direction (see, the arrow in FIG. 1B).

When an $MoS_2$ layer is formed in a nano-ribbon structure, the atoms at the edge form an energy state, and the energy state is different between the zigzag edge structure and the armchair edge structure. In this disclosure, a nano-ribbon structure refers to an elongated shape having a width is equal to or less than 100 nm, in some embodiments. In other embodiments, a nano-ribbon structure has a width equal to or less than 50 nm. An aspect ratio (length/width) of the nanoribbon is 2 or more in some embodiments, and in other embodiments, a nano-ribbon structure has an aspect ratio (length/width) of 5 or more.

Figure 1C:
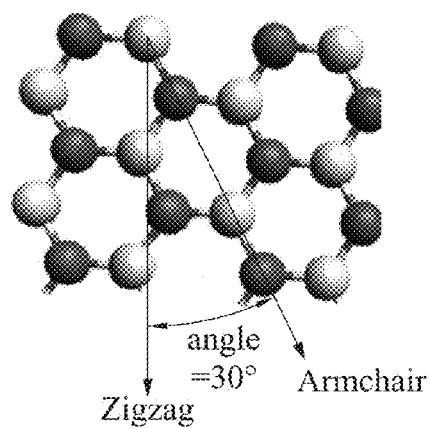
FIG. 1C shows a relationship between a zigzag edge structure and an armchair edge structure.

FIG. 1C shows a relationship between a zigzag edge structure and an armchair edge structure. As shown in FIG. 1C, the angle between the zigzag edge direction and the armchair direction is 30°.

Figure 2A:
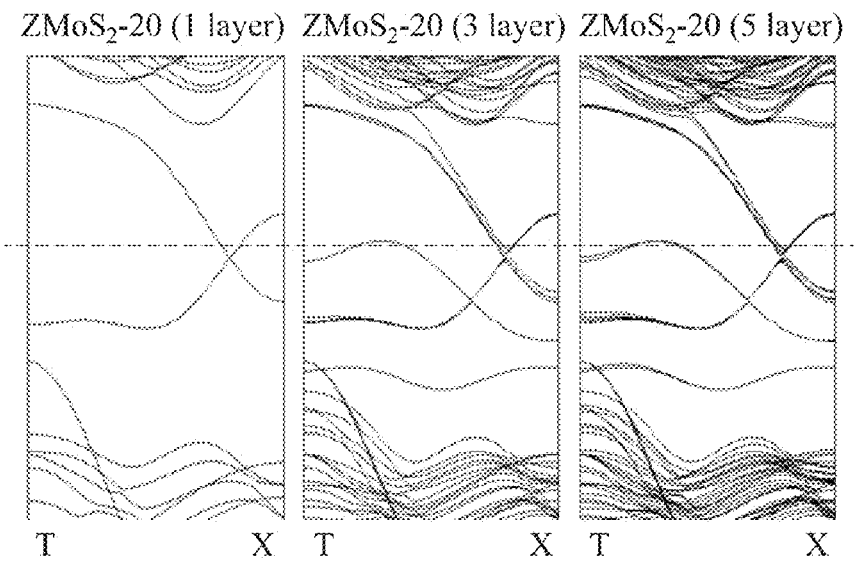
FIG. 2A shows a simulated band diagram for an $MoS_2$ nano-ribbon with a zigzag edge structure.
Figure 2B:
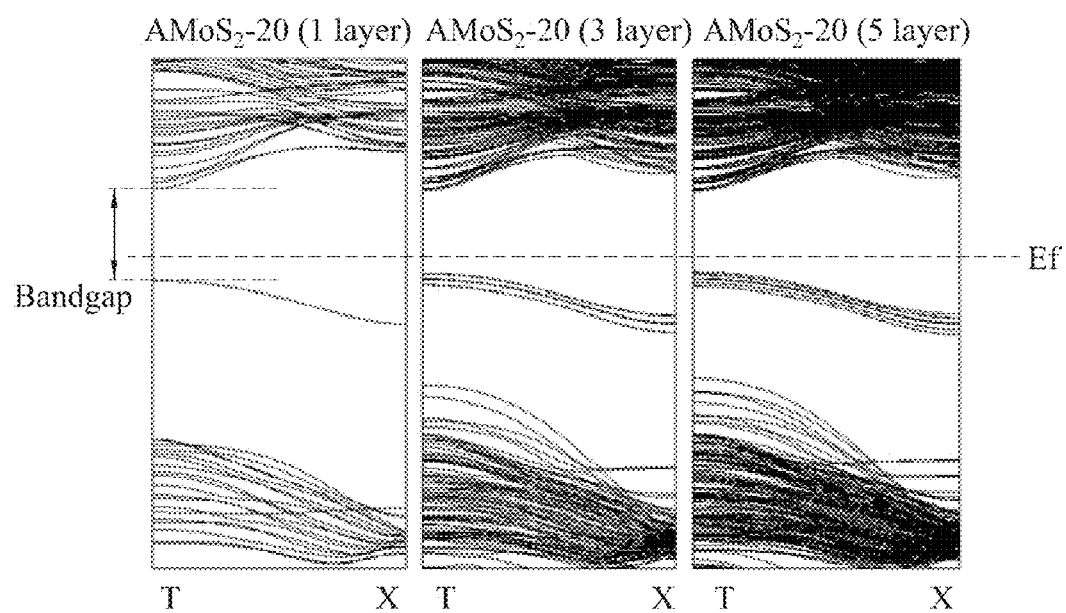
FIG. 2B shows a simulated band diagram for an $MoS_2$ nano-ribbon with an armchair edge structure.

FIG. 2A shows a simulated band diagram for an $MoS_2$ nano-ribbon with a zigzag edge structure ("$ZMoS_2$-20"), and FIG. 2B shows a simulated band diagram for an $MoS_2$ nano-ribbon with an armchair edge structure ("$AMoS_2$-20"). To analyze the electrical state of each edge structure, a simulation using tight binding method was performed to calculate the E-k relation of $MoS_2$ nano-ribbons with different thickness for respective edge structures. In FIG. 2A, the width of the nano-ribbon was set at 2.75 nm, and in FIG. 2B, the width of the nano-ribbon was set at 3.17 nm.

As shown in FIG. 2B, the nano-ribbon with the armchair edge structure has edge states with a narrow band width, creating a bad gap, indicating that the nano-ribbon with the armchair edge structure will function like semiconductor. In contrast, as shown in FIG. 2A, the nano-ribbon with the zigzag edge structure has the edge states falling across the whole band gap, indicating that the nano-ribbon with the zigzag edge structure will function like metal.

The energy state of the nano-ribbon may be affected by the width of the nano-ribbon, because two edges contribute the carrier transportation. As the nano-ribbon width decreases, the number of bulk states decreases, while the number of edge states remains the same. As a result, the density of state of the edges increases. Therefore, to increase the total current, it is advantageous to utilize a finger array with short period structures. The smaller nanoribbon width with more fingers can increase the conductivity.

Based on the foregoing analysis, the inventors of the present disclosure employed $MoS_2$ nano-ribbons having a zigzag edge structure as source and drain of an FET, which contact with a source electrode metal and a drain electrode metal, respectively.

Figure 3A:
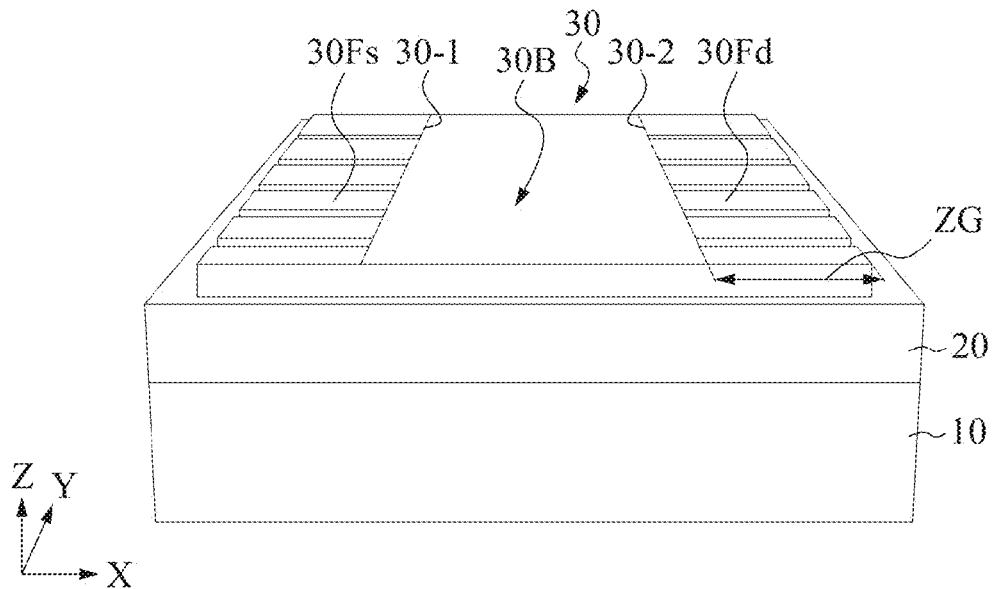
FIG. 3A shows an exemplary schematic view illustrating a structure of an $MoS_2$ layer for an FET and FIG. 3B shows an exemplary schematic view illustrating a structure of an $MoS_2$ layer with source/drain electrodes, according to one embodiment of the present disclosure.
Figure 3B:
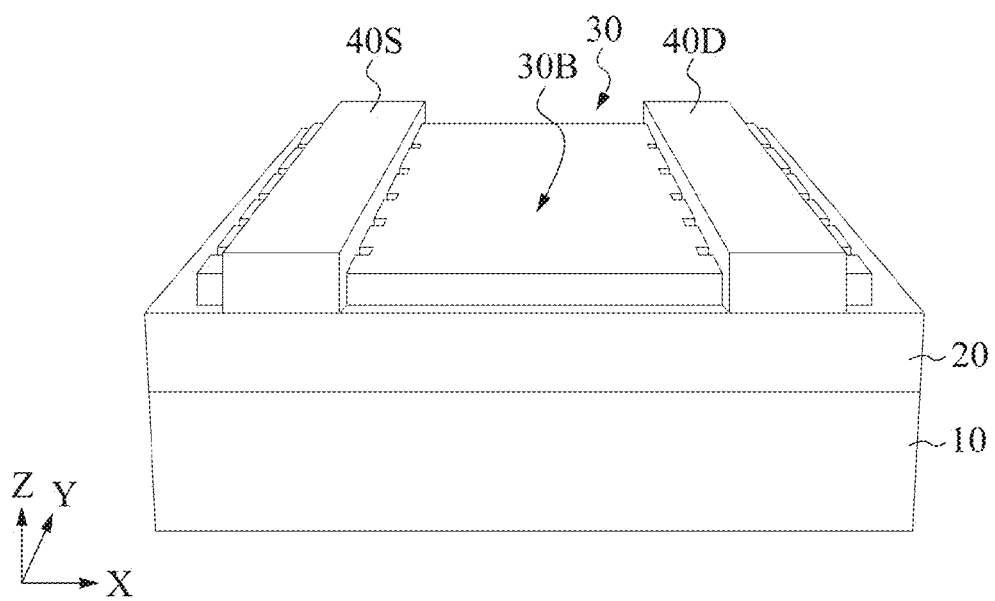

FIG. 3A shows an exemplary schematic view illustrating a structure of an $MoS_2$ layer for an FET and FIG. 3B shows an exemplary schematic view illustrating a structure of an $MoS_2$ layer with source/drain electrodes, according to one embodiment of the present disclosure.

As shown in FIG. 3A, a two-dimensional (2D) layer, e.g., $MoS_2$ layer 30 is formed on a dielectric layer 20 that is formed on a substrate 10. The $MoS_2$ layer 30 includes a body region 30B having a first side 30-1 extending in the Y direction and a second side 30-2 extending in the Y direction and opposite to the first side 30-1. The body region 30B is a channel of the FET. The body region 30B is a bulk without any slits or openings, and has a substantially rectangular shape. In certain embodiments, plural body regions are provided.

The $MoS_2$ layer 30 includes further includes first finger regions 30Fs (plural nano-ribbons), each of which protrudes from the first side 30-1 of the body region, and second finger regions 30Fd, each of which protrudes from the second side 30-2 of the body region. Each of the first finger regions 30Fs and each of the second finger regions 30Fd extend along the X direction, which corresponds to a zigzag edge direction ZG of the $MoS_2$ layer 30. The finger structures may be referred to as a comb structure, in which teeth of the comb structure correspond to the finger regions.

As shown in FIG. 3B, a source electrode 40S covers the first finger regions 30Fs, and a drain electrode 40D covers the second finger regions 30Fd.

In some embodiments, the dielectric layer 20 functions as a gate dielectric layer and in such a case, the substrate 10 is a conductive material (e.g., a metal) functioning as a gate electrode. In other embodiments, the substrate 10 is silicon.

Figure 4:
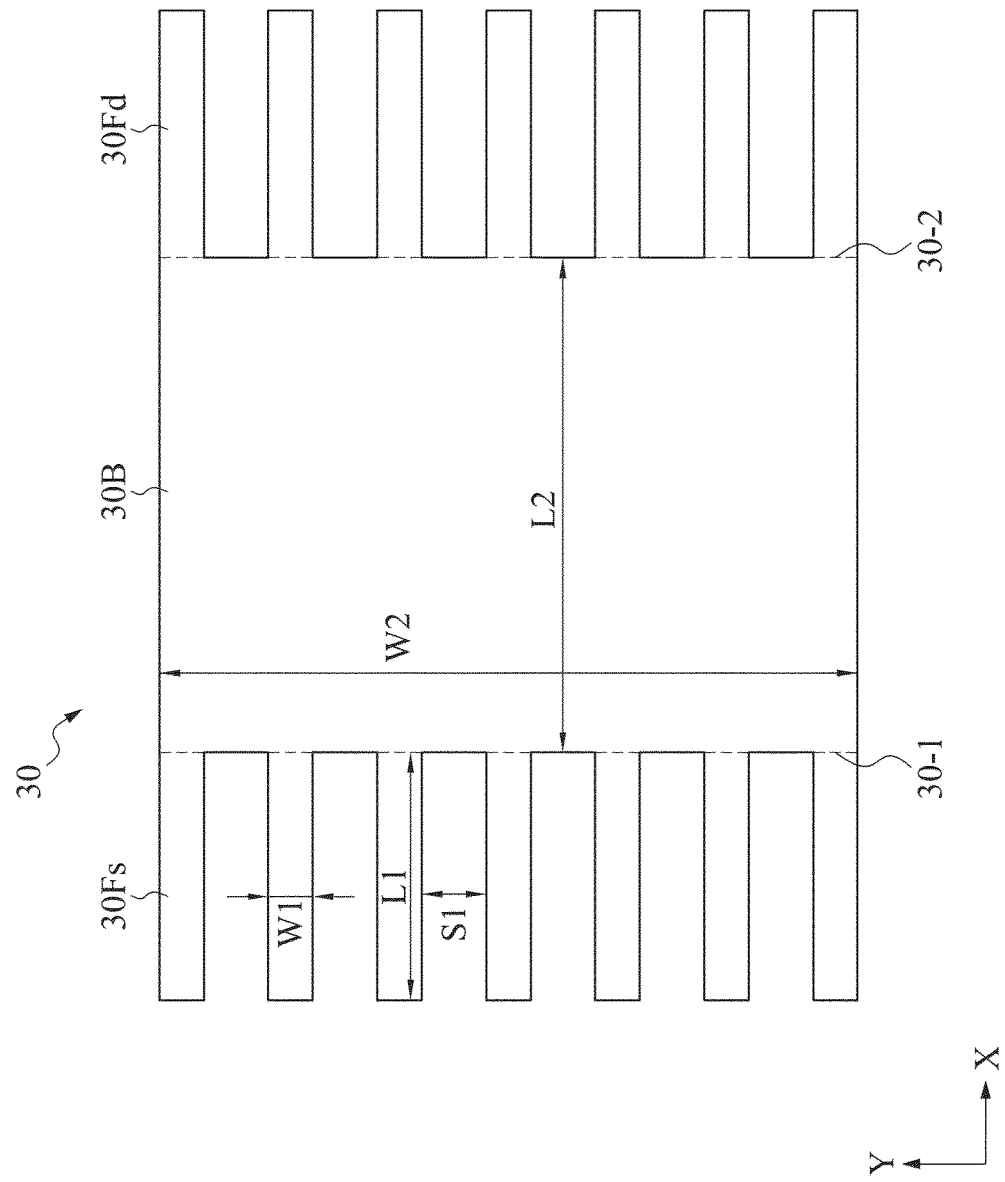
FIGS. 4-6 show an exemplary plan view illustrating a structure of an $MoS_2$ layer for an FET according to embodiments of the present disclosure.

FIG. 4 shows an exemplary plan view illustrating a structure of the $MoS_2$ layer 30. As set forth above, the $MoS_2$ layer 30 includes the body region 30B, the first finger regions (plural nano-ribbons) 30Fs and the second finger regions 30Fd. Each of the first and second finger regions has an elongated shape, e.g., a substantially rectangular shape, and has a long side extending in the X direction a short side extending in the Y direction shorter than the long side.

A width W1 of each of the first and or second finger regions in the Y direction is in a range between about 2 nm and about 50 nm in some embodiments. The width W1 is in a range from about 5 nm to about 30 nm in other embodiments. A length L1 of each of the first and second finger regions in the X direction is in a range between twice the width W1 and about 10 μm in some embodiments. The length L1 is in a range from about 20 nm to about 200 nm in other embodiments.

As shown in FIG. 4, the first and second finger regions are spaced apart from each other in the Y direction, forming a line-and-space pattern. A space S1 between adjacent two finger regions is in a range between about 2 nm to about 100 nm in some embodiments. The space S1 is in a range from about 5 nm to about 50 nm in other embodiments. A ratio of the space to the width (S1/W1) is in a range from about 1 to about 5 in some embodiments and is in a range from about 1.5 to about 2.5 in other embodiments.

The body region 30B has a substantially rectangular shape having a width W2 and length L2. The width W2 can be determined according to a desired current capacity of the FET, and the length L2 can be determined according to a desired speed of the FET. In some embodiments, the width W2 is in a range from about 100 nm to about 1 μm, and the length L2 is in a range from about 10 nm to about 500 nm. It is noted that if the width W2 of the body region 30B becomes too small, the body region would become metal-like, and would not function as an FET. An aspect ratio of the length L1 to the width W1 (L1/W1) is at least 2, in some embodiments. In other embodiments, the aspect ratio is at least 5. The upper limit of the aspect ratio can be practically determined and may be up to 1000.

The number of the finger regions may is not limited. In some embodiment, the number of the first (and second) finger regions is 5-20. The number of the first finger regions may be equal to the number of the second finger regions, or greater or smaller than the number of the second finger regions.

Figure 5:
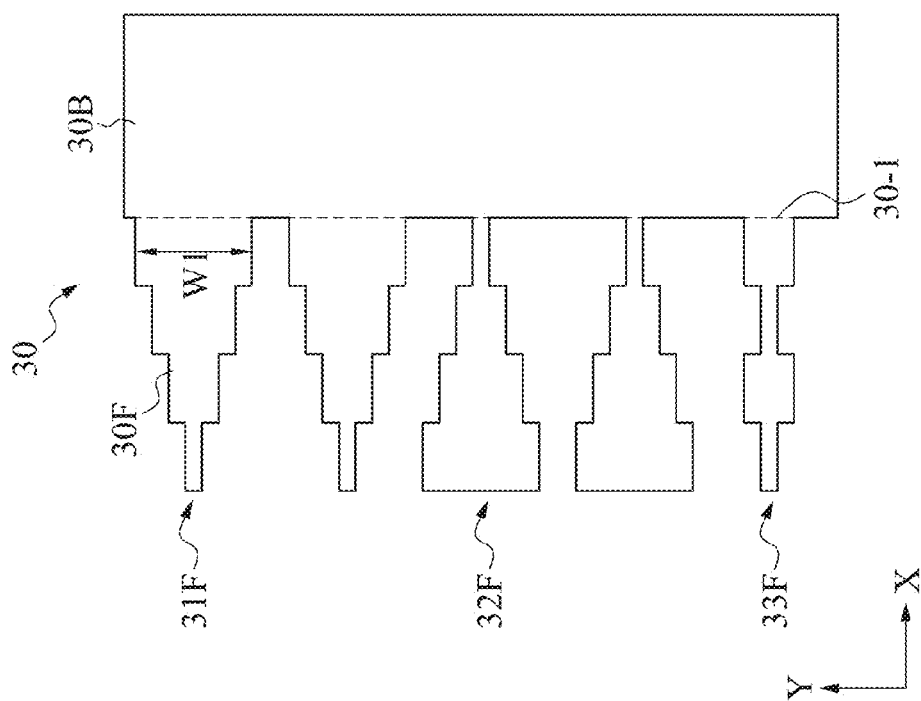

FIG. 5 shows an exemplary plan view illustrating a structure of the $MoS_2$ layer 30 according to another embodiment of the present disclosure. In FIG. 4, the width W1 of the finger regions is substantially constant along the X direction. In FIG. 5, the width W1 of each of the finger regions varies.

In one embodiment, the width W1 of the finger region 31F decreases in a step-wise manner as a distance from the first side 30-1 increases. In another embodiment, the width W1 of the finger region 32F increases in a step-wise manner as a distance from the first side 30-1 increases. In further another embodiment, the width W1 of the finger region 33F alternately decreases and increases in a step-wise manner as a distance from the first side 30-1 increases. The number of the steps is at least one. In all cases of FIG. 5, the sides of each segment of the finger region in the X direction are parallel to the X direction, i.e., the zigzag edge direction.

Figure 6:
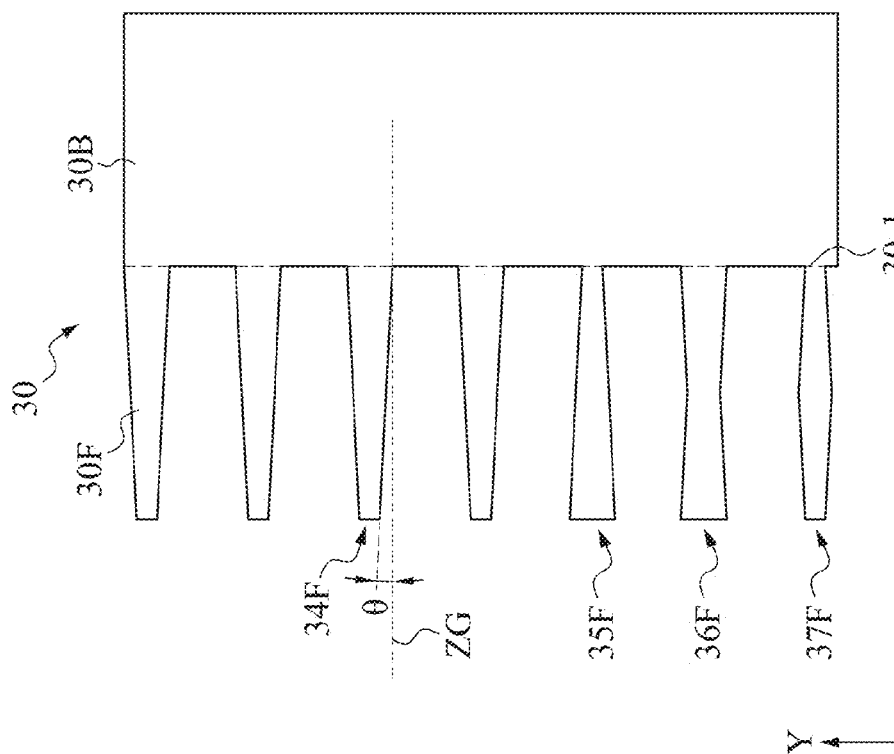

FIG. 6 shows an exemplary plan view illustrating a structure of the MoS$_2$ layer 30 according to another embodiment of the present disclosure. In FIG. 5, the width W1 of each of the finger regions varies in a step-wise manner. In FIG. 6, W1 of each of the finger regions gradually varies.

In one embodiment, the width W1 of the finger region 34F gradually decreases as a distance from the first side 30-1 increases. In another embodiment, the width W1 of the finger region 35F gradually increases as a distance from the first side 30-1 increases. In further another embodiment, the width W1 of the finger region 36F gradually decreases and then increases (this may be repeated) as a distance from the first side 30-1 increases. In yet another embodiment, the width W1 of the finger region 37F gradually increases and then decreases (this may be repeated) as a distance from the first side 30-1 increases.

When the W1 of each of the finger regions gradually varies, the long side of the finger region forms angles with the X direction, i.e., the zigzag direction, and the smaller angle θ formed by the long side and the X is in a range from −10° and 10°. If the angle is 30°, the edge structure becomes the armchair edge structure, as shown in FIG. 1C.

Figure 7A:
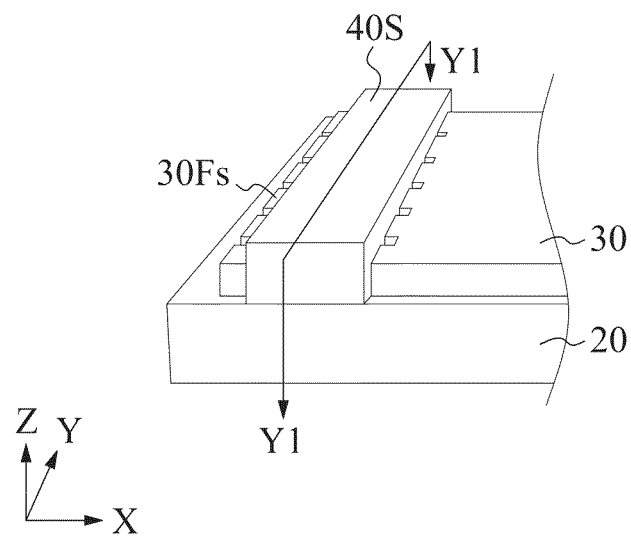
FIGS. 7A and 7B show exemplary schematic views of a structure around a source/drain electrode.
Figure 7B:
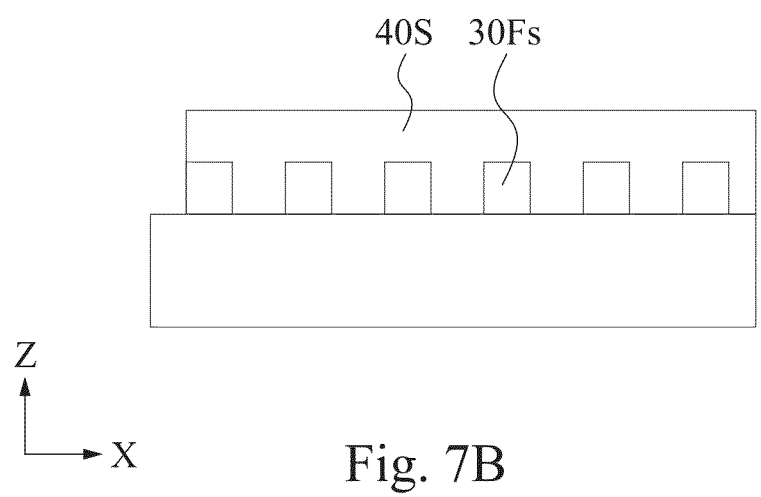

FIGS. 7A and 7B show exemplary schematic views of a structure around a source/drain electrode. FIG. 7B is a cross sectional view corresponding to line Y1-Y1 of FIG. 7A.

The source electrode 40S covers the first finger regions 30Fs. As shown in FIG. 7B, the source electrode 40S covers an upper surface and two opposing side surfaces of the first finger regions 30Fs so that the source electrode 40S in in direct contact with the zigzag edge of each of the first finger regions 30Fs. The drain electrode has a similar structure.

FIGS. 8A-9C show exemplary views illustrating sequential manufacturing operations for an FET using an MoS$_2$ layer according to one embodiment of the present disclosure. It is understood that additional operations can be provided before, during, and after processes shown by FIGS. 8A-9C, and some of the operations described below can be replaced or eliminated, for additional embodiments of the method. The order of the operations/processes may be interchangeable.

Figure 8A:
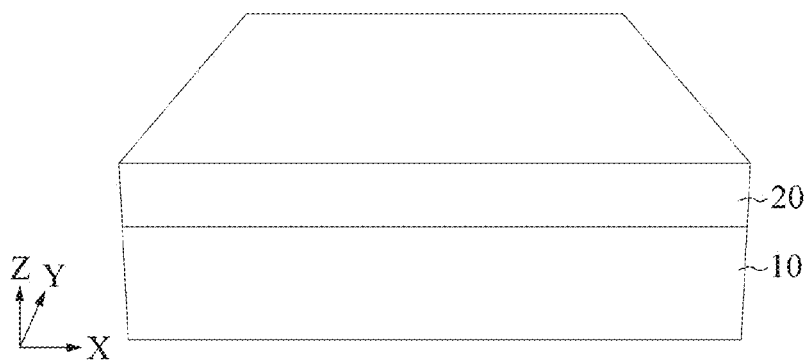
FIGS. 8A-9C show exemplary views illustrating sequential manufacturing operations for an FET using an $MoS_2$ layer according to one embodiment of the present disclosure.

As shown in FIG. 8A, a dielectric layer 20 is formed on a substrate 10. The dielectric layer 20 includes one or more layers of SiO$_2$, SiN, SiON, Al$_2$O$_3$, HfO$_2$ or other suitable materials in some embodiments. In certain embodiments, the dielectric layer 20 includes oxides of Li, Be, Mg, Ca, Sr, Sc, Y, Zr, La, Ce, Pr, Nd, Sm, Eu, Gd, Tb, Dy, Ho, Er, Tm, Yb, Lu, and/or mixtures thereof. The dielectric layer 20 can be formed by chemical vapor deposition (CVD), physical vapor deposition (PVD) or atomic layer deposition (ALD). A thickness of the dielectric layer 20 is in a range from about 10 nm to about 1000 nm in some embodiments. The substrate 10 can be any material that can support an FET. In one embodiment, a conductive material, such as a metal, or a semiconductor material, such as silicon, is used as the substrate 10.

When a back-gate type FET is formed, the substrate 10 is made of a conductive material, and the dielectric layer 20 is made of one or more of SiO$_2$, HfO$_2$ and Al$_2$O$_3$ in some embodiments. The thickness of the dielectric layer 20 for the back-gate type FET is in a range from about 2 nm to about 20 nm in some embodiments.

Figure 8B:
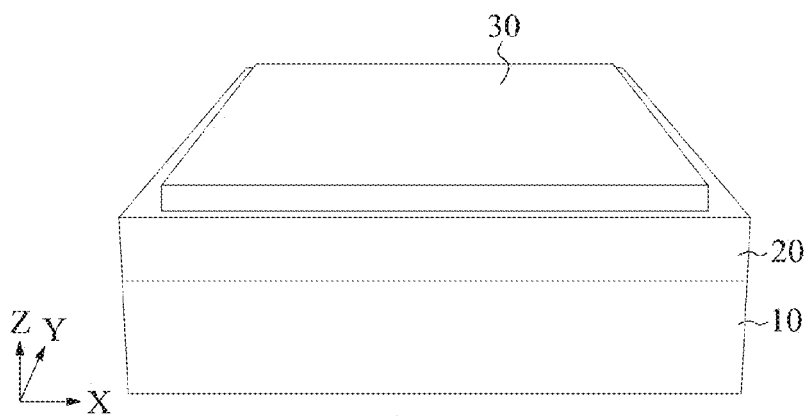

Next, as shown in FIG. 8B, an MoS$_2$ layer 30 is formed on the dielectric layer 20. The MoS$_2$ layer 30 can be a single (mono) layer or multiple layers. The number of MoS$_2$ layers is not limited. In some embodiments, the number of MoS$_2$ layers is in a range from one to 200. In other embodiments, the number of MoS$_2$ layers is in a range from 10 to 100.

The MoS$_2$ layer 30 can be formed by using CVD. In the CVD, MoO$_3$ and S powders are used as source materials, and the powders are heated in a reaction chamber. The reaction chamber is heated to 600-700° C. in a nitrogen environment. In the heated environment, the MoO$_3$ powder is reduced by the sulfur vapor to form volatile suboxide MoO$_{3-x}$. The suboxide compounds diffuse over the substrate and further react with sulfur vapor to grow the MoS$_2$ layer 30 on the dielectric layer 20 formed on the substrate 10. By adjusting the reaction time or the flow of a carrier gas (e.g., nitrogen), the number of MoS$_2$ layers can be controlled.

After the MoS$_2$ layer 30 is formed, a crystal orientation of the MoS$_2$ layer is determined to find the zigzag edge direction. The orientation of MoS$_2$ layer 30 can be determined by measuring a thermal conductivity or an electronic conductivity of the MoS$_2$ layer 30. The thermal conductivity at room temperature (25° C.) of a nano-ribbon having the armchair edge structures is about 25% lower than that of a nano-ribbon having the zigzag edge structures. The electronic conductivity of the nano-ribbon having the zigzag edge structures is also higher than that of the nano-ribbon having the armchair edge structures. The orientation of MoS$_2$ layer 30 can also be determined by using an X-ray diffraction.

Figure 8C:
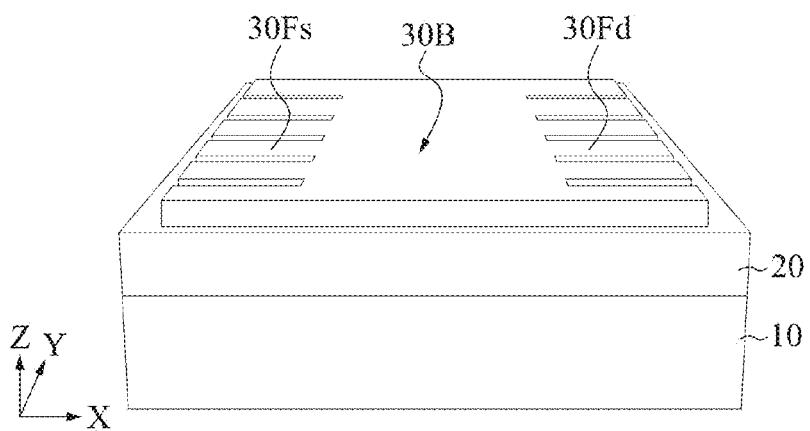

After the zigzag edge direction is determined, a patterning operation including lithography and etching is performed to form the finger regions, as shown in FIG. 8C. The MoS$_2$ layer 30 is patterned such that the finger regions 30Fs and 30Fd extend along the zigzag edge direction. The lithography may include optical lithography, electron beam lithography or X-ray lithography. The body region 30B will become a channel of the FET.

Figure 9A:
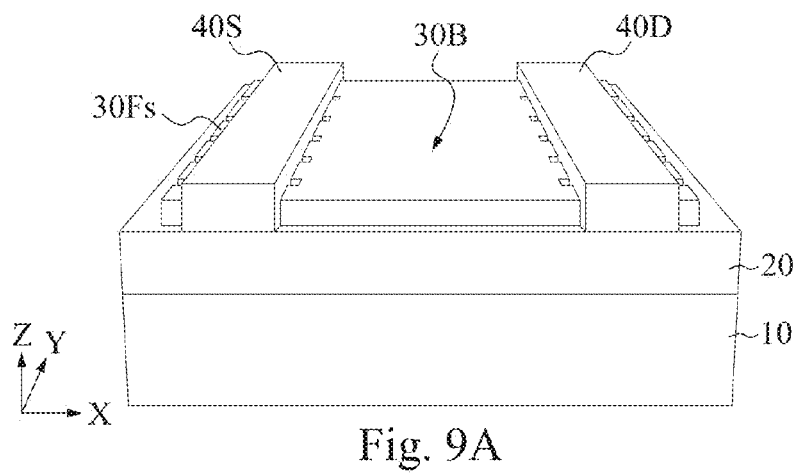

After the finger regions are patterned, a source electrode 40S and a drain electrode 40D are formed, as shown in FIG. 9A. A blanket layer of a metal material is formed over the MoS$_2$ layer 30, and a patterning operation including lithography and etching is performed to define the source electrode 40S and the drain electrode 40D. The metal layer can be formed by PVD including sputtering or CVD, or other suitable film forming methods.

The metal material for the source and drain electrodes has a work function greater than an electron affinity of MoS$_2$. In some embodiments, one or more of Al, Ti, Ni and Au is used for the source and drain electrodes. These metals can form an ohmic contact with the nano-ribbon having the zigzag edge structures.

Figure 9B:
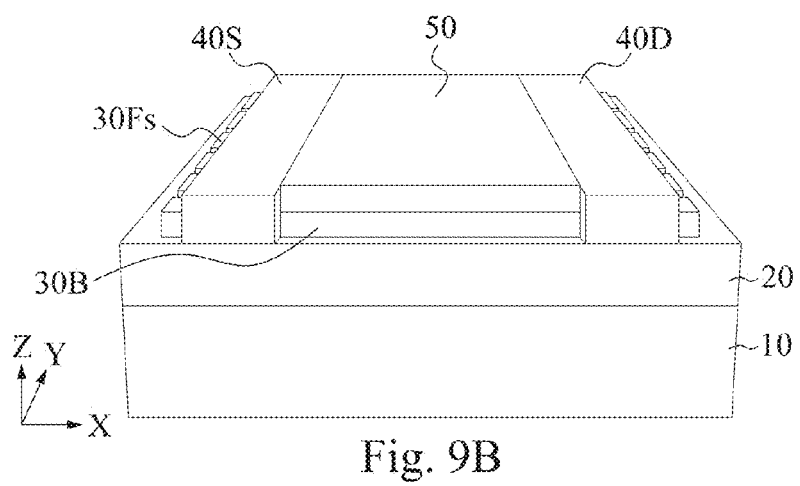

Then, as shown in FIG. 9B, a gate dielectric layer 50 is formed on the body region 30B of the MoS$_2$ layer 30. The gate dielectric layer 50 is made of one or more of SiO$_2$, HfO$_2$ and Al$_2$O$_3$ in some embodiments. In certain embodiments, the gate dielectric layer 50 includes oxides of Li, Be, Mg, Ca, Sr, Sc, Y, Zr, La, Ce, Pr, Nd, Sm, Eu, Gd, Tb, Dy, Ho, Er, Tm, Yb, Lu, and/or mixtures thereof. A blanket layer of a dielectric material for the gate dielectric layer 50 is formed by CVD, PVD or ALD, and a patterning operation is performed to obtain the gate dielectric layer 50 on the body region 30B. The thickness of the gate dielectric layer 50 is in a range from about 2 nm to about 20 nm in some embodiments.

Figure 9C:
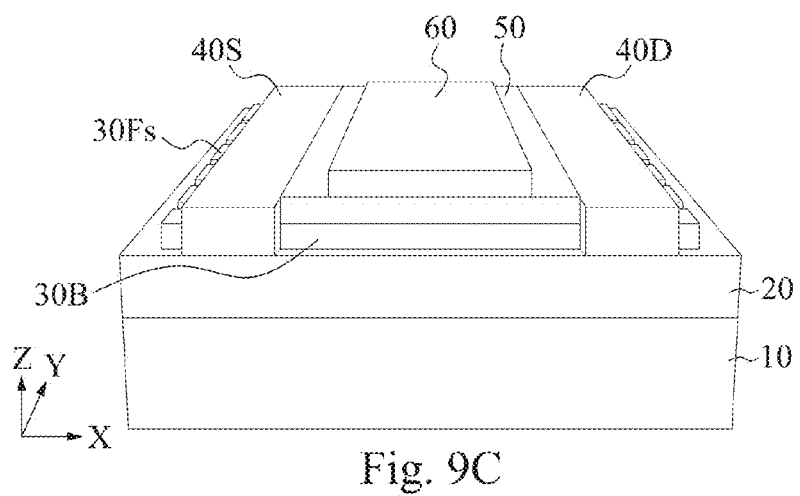

Further, as shown in FIG. 9C, a gate electrode 60 is formed on the gate dielectric layer 50. The gate electrode 60 can be a conductive material, such as a metal (e.g., Al, Ti, Ni and/or Au) and poly silicon.

In certain embodiments, after the finger regions are formed in FIG. 8C, the gate dielectric layer 50 is formed, and then the gate electrode 60, the source electrode 40S and the drain electrode 40D are simultaneously formed by one film forming operation and one patterning operation. Further, in other embodiments, after the MoS$_2$ layer 30 is formed in FIG. 8B, the gate dielectric layer 50 is formed, and then the finger regions are patterned, followed by forming the source electro 40S and the drain electrode 40D and the gate electrode 60.

In the case of the back-gate type FET, the gate dielectric layer 50 and the gate electrode 60 (top gate) are not formed.

FIGS. 10A-11C show exemplary views illustrating sequential manufacturing operations for an FET using an MoS$_2$ layer according to another embodiment of the present disclosure. It is understood that additional operations can be provided before, during, and after processes shown by FIGS. 10A-11C, and some of the operations described below can be replaced or eliminated, for additional embodiments of the method. The order of the operations/processes may be interchangeable. The processes, materials and/or configurations as explained above with respect to FIGS. 8A-9C may be applied to the following embodiments.

In the embodiments of FIGS. 10A-11C, a manufacturing method for a dual-gate (back and front gates) FET is explained.

Figure 10A:
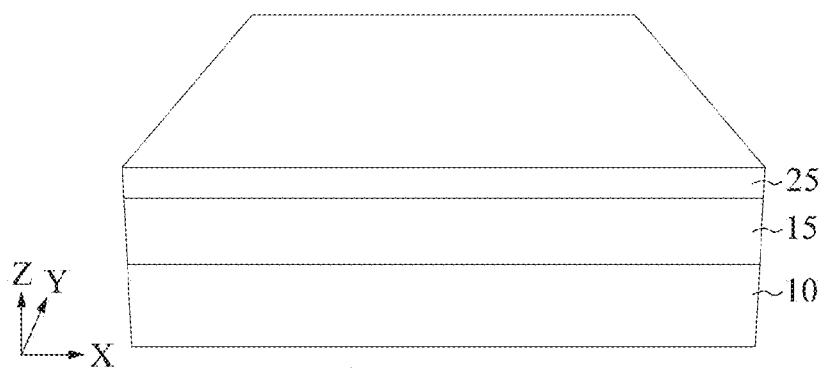
FIGS. 10A-11C show exemplary views illustrating sequential manufacturing operations for an FET using an $MoS_2$ layer according to another embodiment of the present disclosure.

As shown in FIG. 10A, a conductive layer 15, as a back-gate electrode, is formed on the substrate 10. The conductive layer 15 includes one or more layers of metal, such as Al, Cu, Ni, Ti, TiN or W, or polysilicon. Further, a back-gate dielectric layer 25 is formed on the conductive layer 15. The back-gate dielectric layer 25 is made of one or more of SiO$_2$, HfO$_2$ and Al$_2$O$_3$ in some embodiments. In certain embodiments, the back-gate dielectric layer 25 includes oxides of Li, Be, Mg, Ca, Sr, Sc, Y, Zr, La, Ce, Pr, Nd, Sm, Eu, Gd, Tb, Dy, Ho, Er, Tm, Yb, Lu, and/or mixtures thereof. The thickness of the back-gate dielectric layer 25 is in a range from about 2 nm to about 20 nm in some embodiments.

Figure 10B:
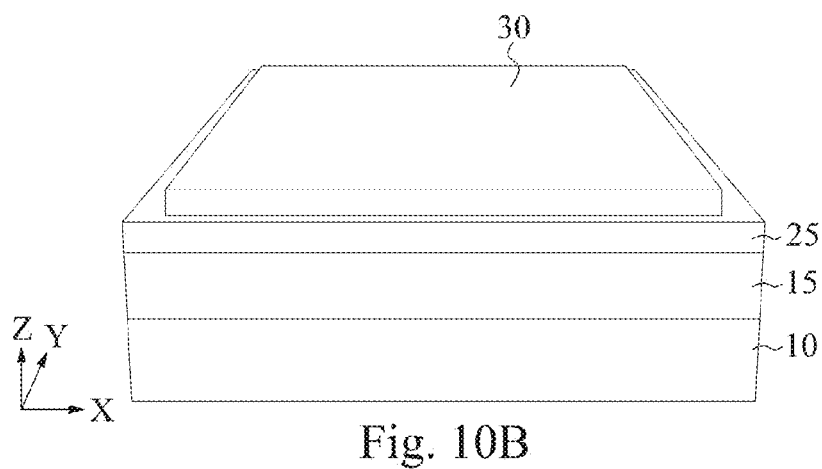

Next, as shown in FIG. 10B, an MoS$_2$ layer 30 is formed on the back-gate dielectric layer 25, similar to FIG. 8B. After the MoS$_2$ layer 30 is formed, a crystal orientation of the MoS$_2$ layer is determined to find the zigzag edge direction.

Figure 10C:
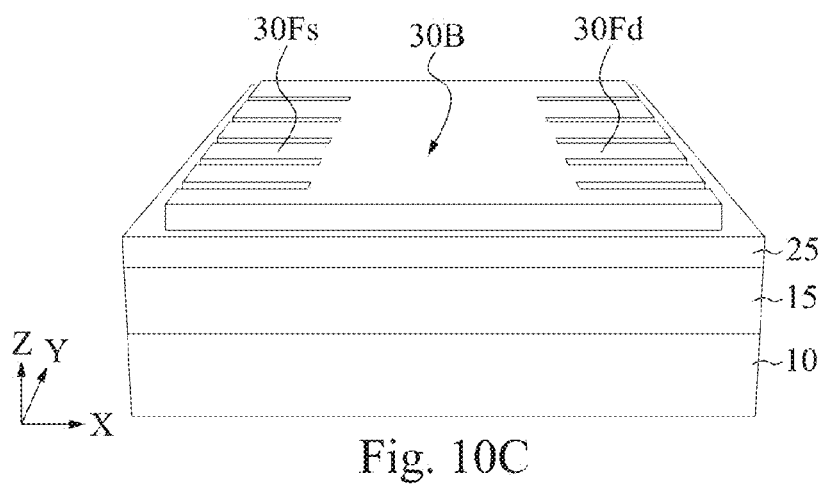

After the zigzag edge direction is determined, similar to FIG. 8C, a patterning operation including lithography and etching is performed to form the finger regions, as shown in FIG. 10C.

Figure 11A:
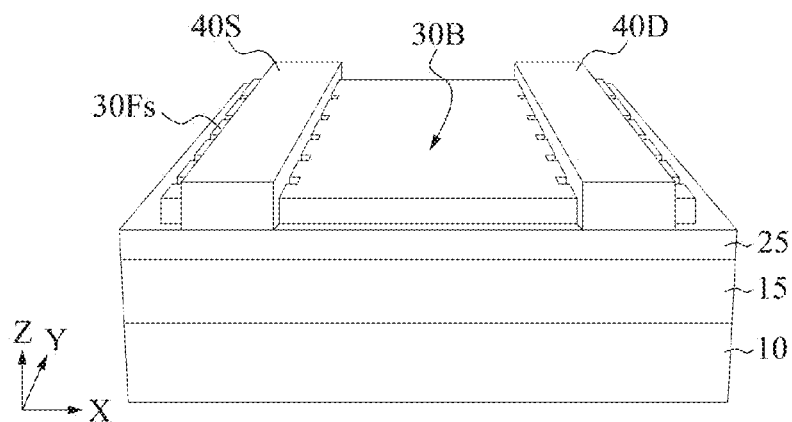

After the finger regions 30Fs and 30Fd are patterned, similar to FIG. 9A, a source electrode 40S and a drain electrode 40D are formed, as shown in FIG. 11A.

Figure 11B:
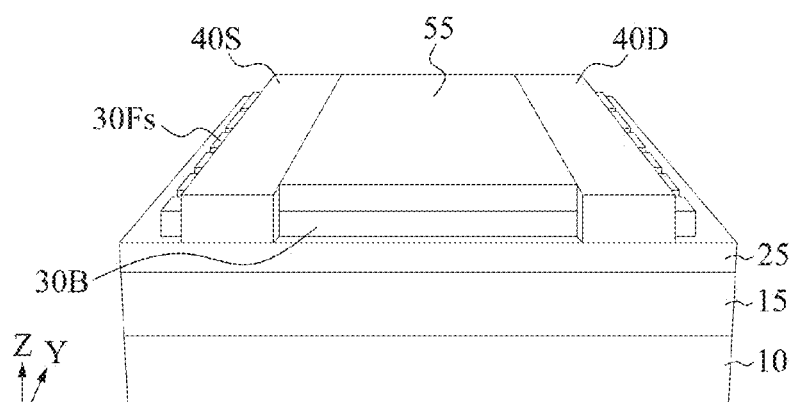

Then, as shown in FIG. 11B, a front-gate dielectric layer 55 is formed on the body region 30B of the MoS$_2$ layer 30. The front-gate dielectric layer 55 is made of one or more of SiO$_2$, HfO$_2$ and Al$_2$O$_3$, and is formed by similar processes to the gate dielectric layer 50. The thickness of the front-gate dielectric layer 55 is in a range from about 2 nm to about 20 nm in some embodiments.

Figure 11C:
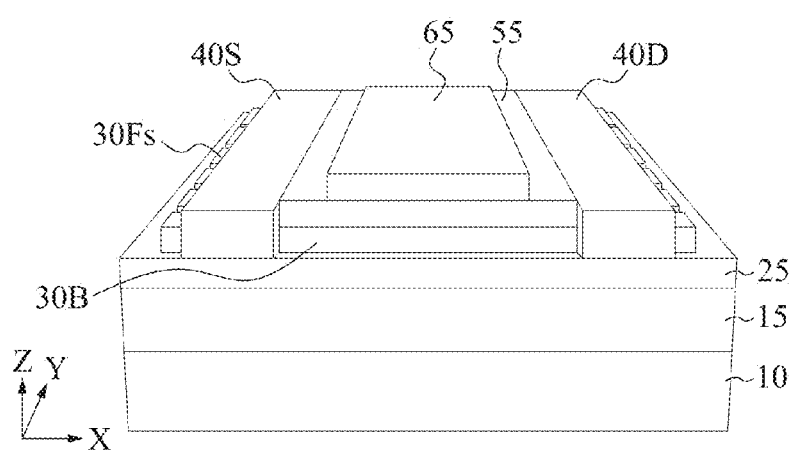

Further, as shown in FIG. 11C, similar to FIG. 9C, a front-gate electrode 65 is formed on the front-gate dielectric layer 55. The front-gate electrode 65 can be a conductive material, such as metal (e.g., Al, Ti, Ni and/or Au) and poly silicon.

In certain embodiments, after the finger regions are formed in FIG. 10C, the front-gate dielectric layer 55 is formed, and then the front-gate electrode 65, the source electrode 40S and the drain electrode 40D are simultaneously formed by one film forming operation and one patterning operation. Further, in other embodiments, after the MoS$_2$ layer 30 is formed in FIG. 10B, the front-gate dielectric layer 55 is formed, and then the finger regions are patterned, followed by forming the source electrode 40S and the drain electrode 40D and the front-gate electrode 65.

Figure 12A:
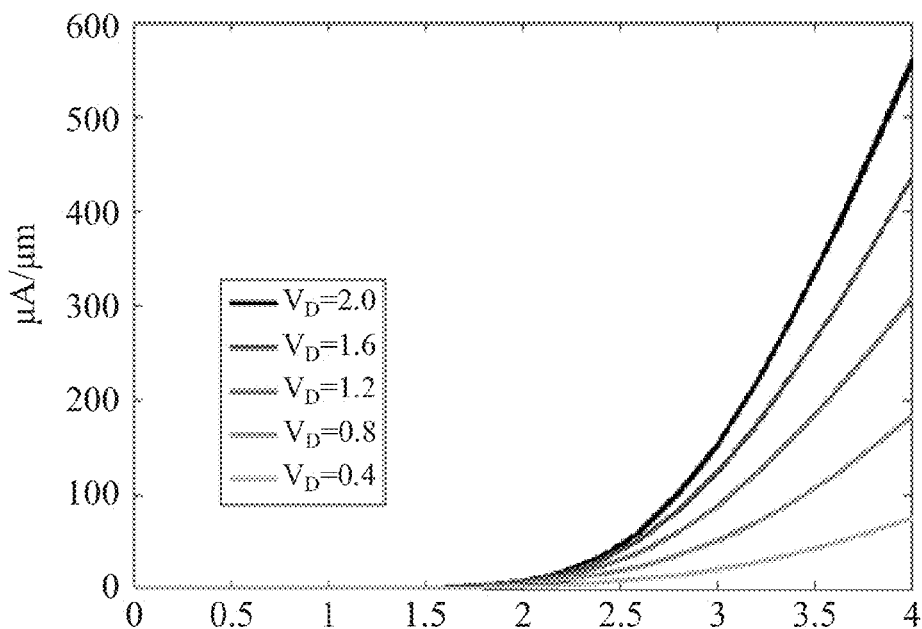
FIG. 12A shows simulated $I_D$-$V_G$ characteristics of one embodiment of the present disclosure.
Figure 12B:
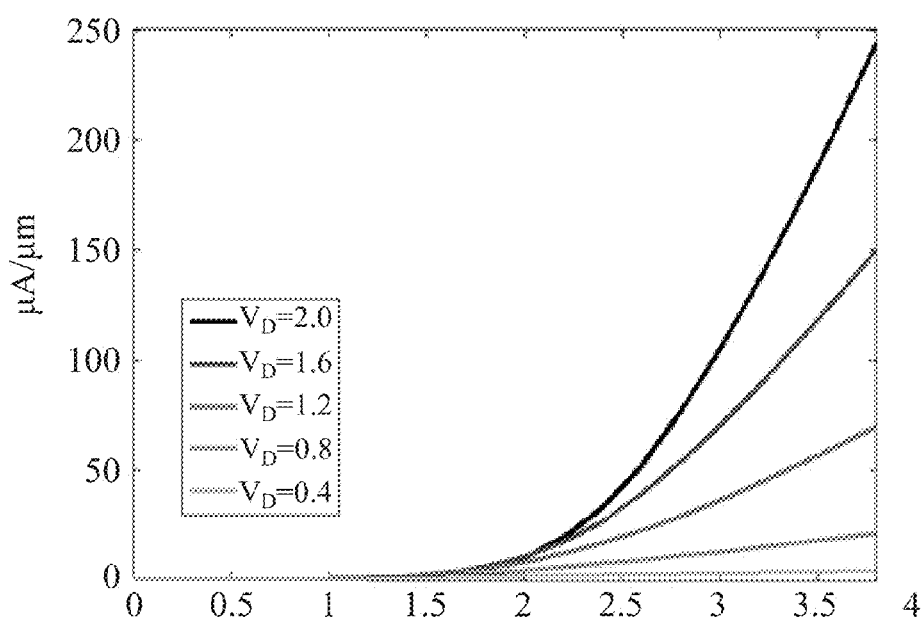
FIG. 12B shows simulated $I_D$-$V_G$ characteristics of a comparative example.

FIG. 12A shows a simulated $I_D$-$V_G$ characteristic for an MoS$_2$ FET having finger regions in the source and drain (a nano-ribbon-source/drain FET), and FIG. 12B shows a simulated $I_D$-$V_G$ characteristic for an MoS$_2$ FET without having finger regions (i.e., bulk) in the source and drain (a bulk-source/drain FET). In FIGS. 12A and 12B, SiO$_2$ is assumed as the gate dielectric layer. As shown in FIGS. 12A and 12B, the nano-ribbon-source/drain FET showed a superior $I_D$-$V_G$ characteristic.

Figure 13A:
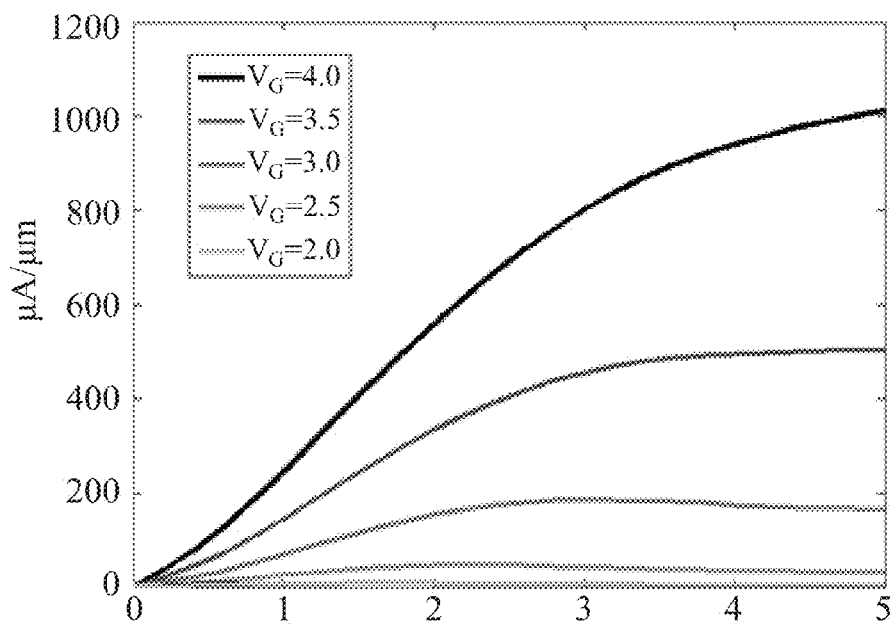
FIG. 13A shows simulated $I_D$-$V_D$ characteristics of one embodiment of the present disclosure.
Figure 13B:
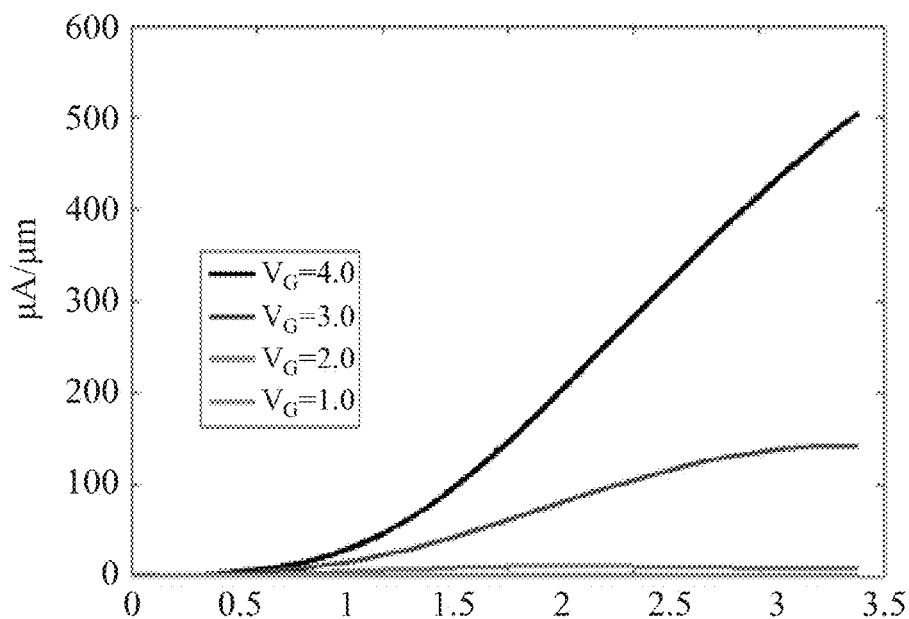
FIG. 13B shows simulated $I_D$-$V_D$ characteristics of a comparative example.

FIG. 13A shows a simulated $I_D$-$V_D$ characteristic for an MoS$_2$ FET having finger regions in the source and drain, and FIG. 13B shows a simulated $I_D$-$V_D$ characteristic for an MoS$_2$ FET without having finger regions (i.e., bulk) in the source and drain (a bulk-source/drain FET). In FIGS. 13A and 13B, SiO$_2$ is assumed as the gate dielectric layer. As shown in FIGS. 13A and 13B, the nano-ribbon-source/drain FET showed a superior $I_D$-$V_D$ characteristic. In particular, in the bulk-source/drain FET, because of a Schottky contact between the source and drain of the bulk MoS$_2$ and the source and drain metal electrode, a contact resistance became higher and the $I_D$-$V_D$ characteristic was degraded.

Figure 14A:
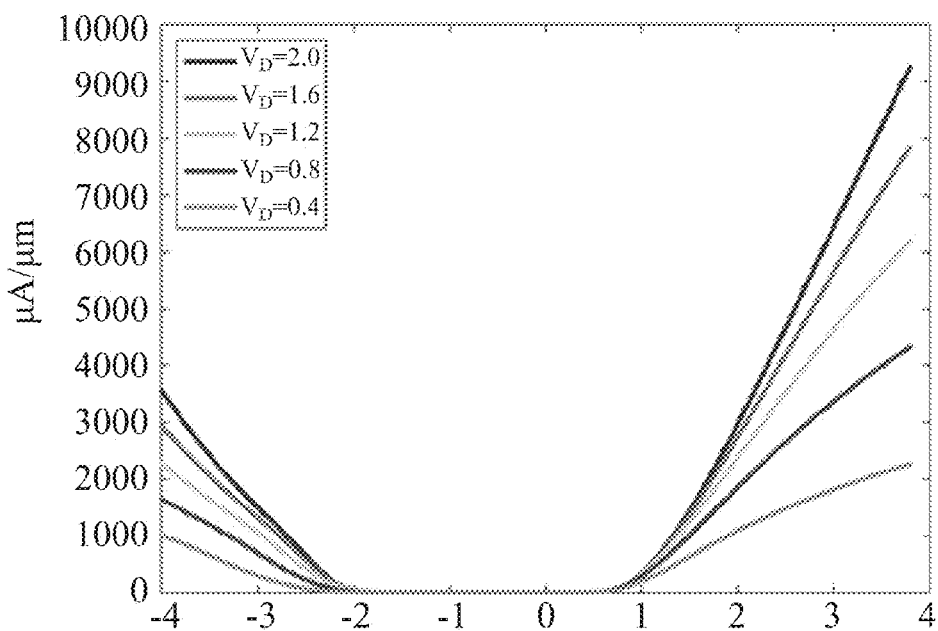
FIG. 14A shows simulated $I_D$-$V_G$ characteristics of one embodiment of the present disclosure.
Figure 14B:
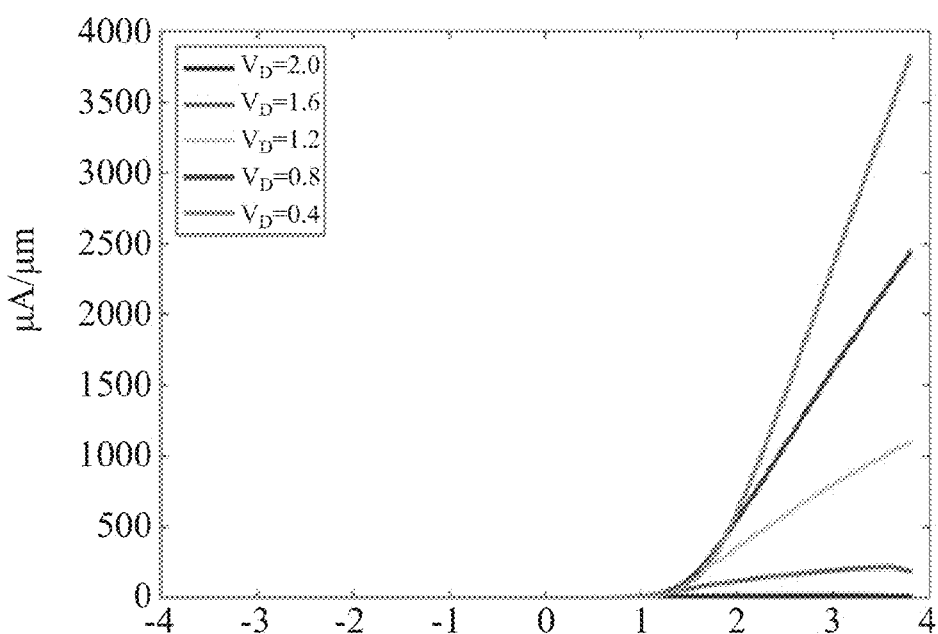
FIG. 14B shows simulated $I_D$-$V_G$ characteristics of e a comparative example.

FIG. 14A shows a simulated $I_D$-$V_G$ characteristic for an MoS$_2$ device having finger regions in the source and drain (a nano-ribbon device), and FIG. 14B shows a simulated $I_D$-$V_G$ characteristic for an MoS$_2$ device without having finger regions (i.e., bulk) in the source and drain (a bulk device).

As shown in FIG. 14A, at the negative gate voltage, the nano-ribbon device showed a bipoloar characteristic. Thus, an n-MOS and a p-MOS can have the same structure. By using a high-k gate dielectric layer (e.g., HfO$_2$) and adjusting the bandgap (e.g., with more layers of MoS$_2$), the device performance can further be improved.

Figure 15A:
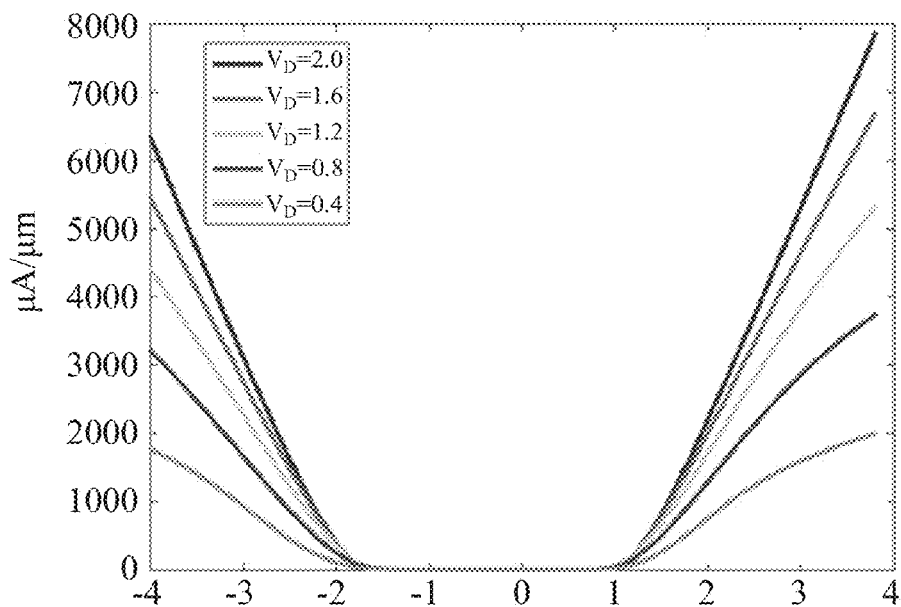
FIG. 15A shows simulated $I_D$-$V_G$ characteristics of one embodiment of the present disclosure, and FIG. 15B show simulated $I_D$-$V_G$ characteristics of a comparative example.
Figure 15B:
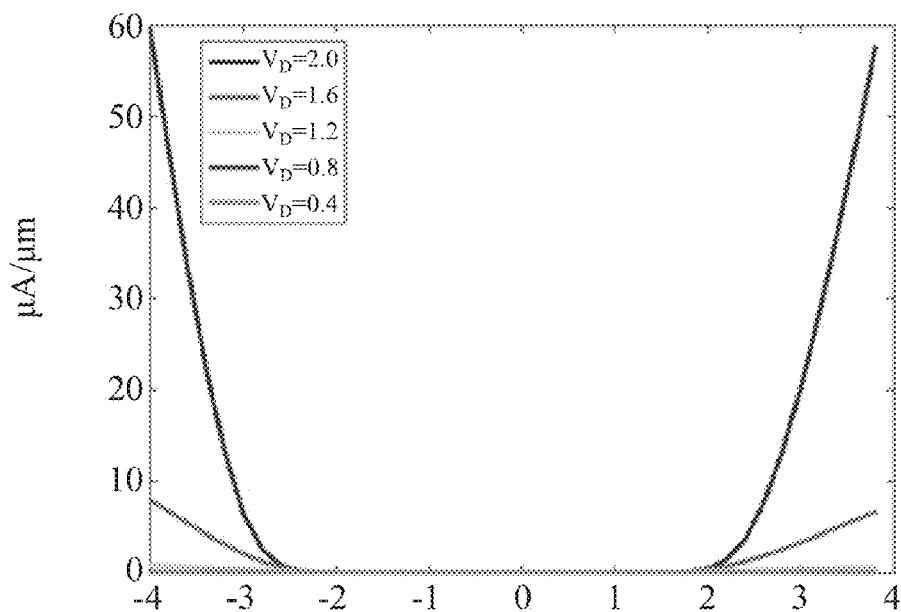

FIG. 15A shows a simulated $I_D$-$V_G$ characteristic for an MoS$_2$ device having finger regions in the source and drain (a nano-ribbon device), and FIG. 15B shows a simulated $I_D$-$V_G$ characteristic for an MoS$_2$ device without having finger regions (i.e., bulk) in the source and drain (a bulk device).

In FIGS. 15A and 15B, a work function adjustment layer for a metal gate is adjusted. By adjusting the metal work function, it is possible to make the bulk MoS$_2$ device with small bandgap (e.g., 1.2 eV), which becomes a bipolar device, as shown in FIG. 15B. However, compared with FIG. 15A, the performance is much poorer than the nano-ribbon device with the same metal work function.

Figure 16A:
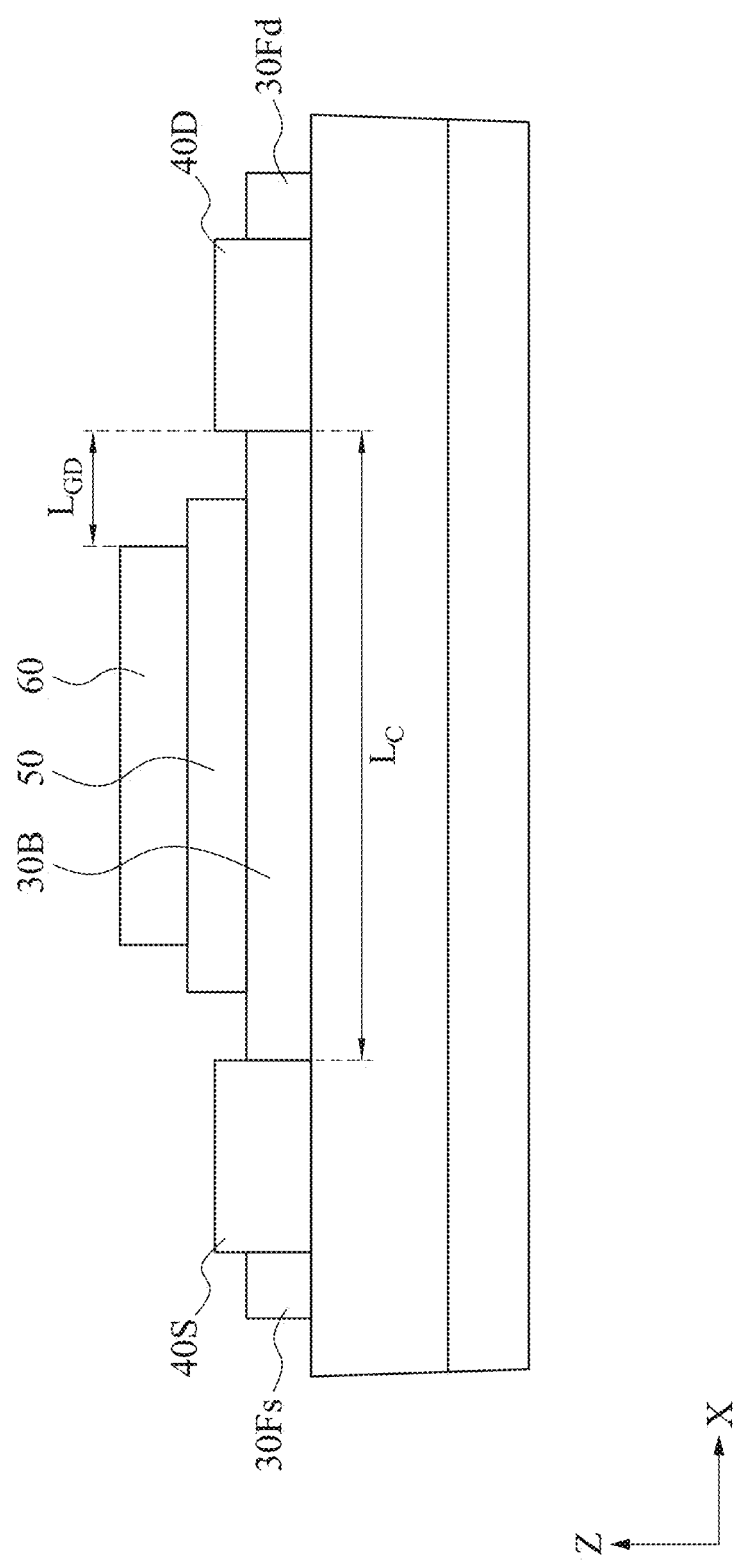
FIGS. 16A-16C show effects of a distance between a gate electrode and a drain electrode $L_{GD}$ of embodiments of the present disclosure.
Figure 16C:
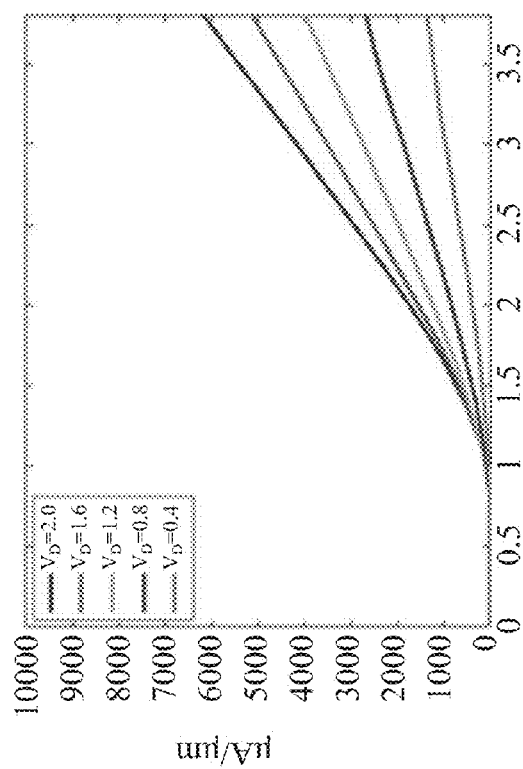
Figure 16B:
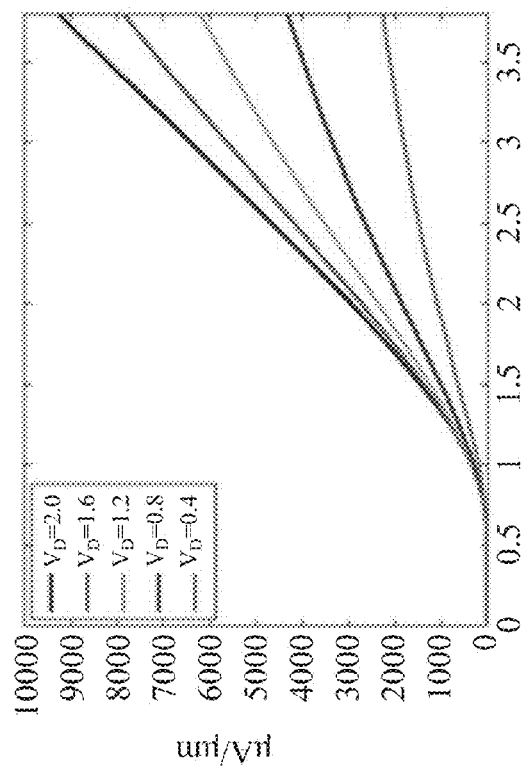

FIGS. 16A-16C show effects of a distance between a gate electrode and a drain electrode $L_{GD}$ with a high-k gate dielectric material. As shown in FIG. 16A, a distance $L_{GD}$ is a distance between the gate electrode 60 (or the front-gate electrode 65) and the drain electrode 40D. FIG. 16B shows a simulated $I_D$-$V_G$ characteristic for an MoS$_2$ nano-ribbon-source/drain FET, when $L_{GD}$ is 2 nm and a channel length $L_C$ is 200 nm, and FIG. 16C shows a simulated $I_D$-$V_G$ characteristic for an MoS$_2$ nano-ribbon-source/drain FET, when $L_{GD}$ is 20 nm and a channel length $L_C$ is 200 nm.

As shown in FIGS. 16B and 16C, as $L_{GD}$ becomes larger, the $I_D$-$V_G$ characteristic become poorer. In particular, when $L_{GD}$ is about 40 nm or more, the characteristics of the FET become significantly poorer.

Further, in the case of a back-gate FET (dual gate FET), a width of the back-gate electrode 65 in the X direction is greater than a channel length $L_C$, which is a space between the source electrode and the drain electrode.

The various embodiments or examples described herein offer several advantages over the existing art. For example, in the present disclosure, by using nano-ribbons of an $MoS_2$ layer (finger regions) for a source and a drain of an FET, it is possible to improve performance of the FET. In particular, by using the nano-ribbons having zigzag edge structures for a source and a drain, a good ohmic contact between the source and drain and the source and drain electrode can be obtained.

It will be understood that not all advantages have been necessarily discussed herein, no particular advantage is required for all embodiments or examples, and other embodiments or examples may offer different advantages.

According to one aspect of the present disclosure, a field effect transistor (FET) includes a gate dielectric layer, a channel layer formed on the gate dielectric layer and a gate electrode. The channel layer includes a body region having a first side and a second side opposite to the first side, the body region being a channel of the FET. The channel layer further includes first finger regions each protruding from the first side of the body region and second finger regions each protruding from the second side of the body region. A source electrode covers the first finger regions, and a drain electrode covers the second finger regions.

According to another aspect of the present disclosure, a field effect transistor (FET) includes a first gate dielectric layer, an $MoS_2$ layer two-dimensionally formed in contact with the gate dielectric layer, a first gate electrode, and a source electrode and a drain electrode. The $MoS_2$ layer includes a body region having a first side and a second side opposite to the first side, the body region being a channel of the FET. The $MoS_2$ layer further includes first finger regions each protruding from the first side of the body region and second finger regions each protruding from the second side of the body. The source electrode covers the first finger regions, and the drain electrode covers the second finger regions. Each of the first finger regions and each of the second finger regions extend along a first direction. The first direction corresponds to a zigzag edge structure of the $MoS_2$ layer.

According to another aspect of the present disclosure, in a method of manufacturing a field effect transistor, an $MoS_2$ layer is formed such that the $MoS_2$ layer is two-dimensionally formed. The $MoS_2$ layer is patterned such that the $MoS_2$ layer includes a body region having a first side and a second side opposite to the first side, and further includes first finger regions each protruding from the first side of the body region and second finger regions each protruding from the second side of the body. A source electrode and a drain electrode are formed such that the source electrode covers the first finger regions and the drain electrode covers the second finger regions. Each of the first finger regions and each of the second finger regions extend along a first direction. The first direction corresponds to a zigzag edge structure of the $MoS_2$ layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A field effect transistor (FET), comprising:
a gate dielectric layer;
a channel layer formed on the gate dielectric layer; and
a gate electrode, wherein:
the channel layer includes a body region having a first side and a second side opposite to the first side, the body region being a channel of the FET,
the channel layer further includes first finger regions each protruding from the first side of the body region and second finger regions each protruding from the second side of the body region,
a source electrode covers the first finger regions, and a drain electrode covers the second finger regions,
the channel layer is a single layer or multiple layers of $MoS_2$,
each of the first finger regions and each of the second finger regions extend along a first direction, and
the first direction corresponds to a zigzag edge structure of the $MoS_2$ layer, which extends perpendicular to atomic bonds located at the edge.

2. The FET of claim 1, wherein a width of each of the first finger regions in a second direction perpendicular to the first direction is in a range between 5 nm and 30 nm.

3. The FET of claim 2, wherein:
a length of each of the first finger regions in the first direction is in a range between twice the width and 10 μm.

4. The FET of claim 1, wherein:
the first finger regions are spaced apart from each other in a second direction perpendicular to the first direction,
a space between adjacent two first finger regions is in a range between 5 nm to 50 nm.

5. The FET of claim 1, wherein an aspect ratio of a length of each of the first finger regions in the first direction to a width of each of the first finger regions in a second direction perpendicular to the first direction is at least 2.

6. The FET of claim 5, wherein:
each of the first finger regions has a long side and a short side shorter than the long side, and
a smaller angle formed by the long side and the first direction is in a range from −10° and 10°.

7. The FET of claim 1, wherein the $MoS_2$ layer includes plural layers of two dimensional $MoS_2$ layers.

8. The FET of claim 1, wherein a width of each of the first finger regions in a second direction perpendicular to the first direction varies.

9. The FET of claim 1, wherein the zigzag edge structure has edge states falling across whole band gap of the $MoS_2$ layer.

10. A field effect transistor (FET), comprising:
a first gate dielectric layer;
an $MoS_2$ layer formed in contact with the gate dielectric layer, the $MoS_2$ layer being a single layer or multiple layers of $MoS_2$;
a first gate electrode; and
a source electrode and a drain electrode, wherein:

the MoS$_2$ layer includes a body region having a first side and a second side opposite to the first side, the body region being a channel of the FET, the MoS$_2$ layer further includes first finger regions each protruding from the first side of the body region and second finger regions each protruding from the second side of the body, the source electrode covers the first finger regions, and the drain electrode covers the second finger regions, each of the first finger regions and each of the second finger regions extend along a first direction, and the first direction corresponds to a zigzag edge structure of the MoS$_2$ layer, which extends perpendicular to atomic bonds located at the edge.

11. The FET of claim 10, further comprising:

a second gate dielectric layer formed such that the body region of the MoS$_2$ layer is disposed between the first gate dielectric layer and the second gate dielectric layer; and a second gate electrode formed such that the second gate dielectric layer is disposed between the body region of the MoS$_2$ layer and the second gate electrode.

12. The FET of claim 10, wherein the MoS$_2$ layer is disposed on a dielectric layer.

13. The FET of claim 12, wherein the first gate dielectric layer, the MoS$_2$ layer, the first gate electrode and the source and drain electrode are disposed on a same side of the dielectric layer.

14. The FET of claim 13, wherein a space between the first gate electrode and the drain electrode is less than 40 nm.

15. The FET of claim 12, wherein the first gate dielectric layer, and the first gate electrode are disposed on a side of the dielectric layer opposite to a side of the dielectric layer on which the MoS$_2$ layer and the source and drain electrode are disposed.

16. The FET of claim 15, wherein a width of the first gate electrode in the first direction is greater than a space between the source electrode and the drain electrode.

17. The FET of claim 10, wherein the first gate dielectric layer includes at least one of SiO$_2$, Al$_2$O$_3$ and HfO$_2$.

18. The FET of claim 10, wherein the source and drain electrodes are made of a metal having a work function greater than an electron affinity of MoS$_2$.

19. A method of manufacturing a field effect transistor, the method comprising:

forming an MoS$_2$ layer, the MoS$_2$ layer being a single layer or multiple layers of MoS$_2$;

patterning the MoS$_2$ layer such that the MoS$_2$ layer includes a body region having a first side and a second side opposite to the first side, and further includes first finger regions each protruding from the first side of the body region and second finger regions each protruding from the second side of the body;

forming a source electrode and a drain electrode such that the source electrode covers the first finger regions and the drain electrode covers the second finger regions, wherein:

each of the first finger regions and each of the second finger regions extend along a first direction, and the first direction corresponds to a zigzag edge structure of the MoS$_2$ layer, which extends perpendicular to atomic bonds located at the edge.

20. The method of claim 19, further comprising, before patterning the MoS$_2$ layer, determining a crystal orientation of the MoS$_2$ layer.

* * * * *